United States Patent [19]

Kawaguchi

[11] Patent Number: 4,805,830
[45] Date of Patent: Feb. 21, 1989

[54] METHOD FOR SOLDERING ARRAYED TERMINALS AND AN AUTOMATIC SOLDERING DEVICE

[75] Inventor: Seiji Kawaguchi, Tokyo, Japan

[73] Assignee: Apollo Seiko Ltd., Tokyo, Japan

[21] Appl. No.: 25,903

[22] Filed: Mar. 13, 1987

[30] Foreign Application Priority Data

Apr. 9, 1986 [JP] Japan .................................. 61-80220
Jul. 18, 1986 [JP] Japan ................................ 61-167869

[51] Int. Cl.⁴ .......................... B23K 3/02; H01L 21/98
[52] U.S. Cl. ...................................... 228/179; 228/51; 228/53; 219/85 G
[58] Field of Search .................... 228/6.2, 44.7, 51, 52, 228/53, 179–180.2; 219/85 D, 85 G

[56] References Cited

U.S. PATENT DOCUMENTS 4,720,035 1/1988 Isogai ..................................... 228/51

FOREIGN PATENT DOCUMENTS 670399 6/1979 U.S.S.R. ................................ 228/6.2

Primary Examiner—Kenneth J. Ramsey
Attorney, Agent, or Firm—Schwartz & Weinrieb

[57] ABSTRACT

A method and device for automatic soldering multiple intermittently arranged terminals a bridging phenomenon from occurring between the soldered terminals by sliding, virtually horizontally, the iron tip of the soldering iron, which is held upon the arrayed terminals after the application of the solder to those terminals, in a direction which is at right angles to the direction of the arrayed terminals, thus separating it from the arrayed terminals.

20 Claims, 13 Drawing Sheets

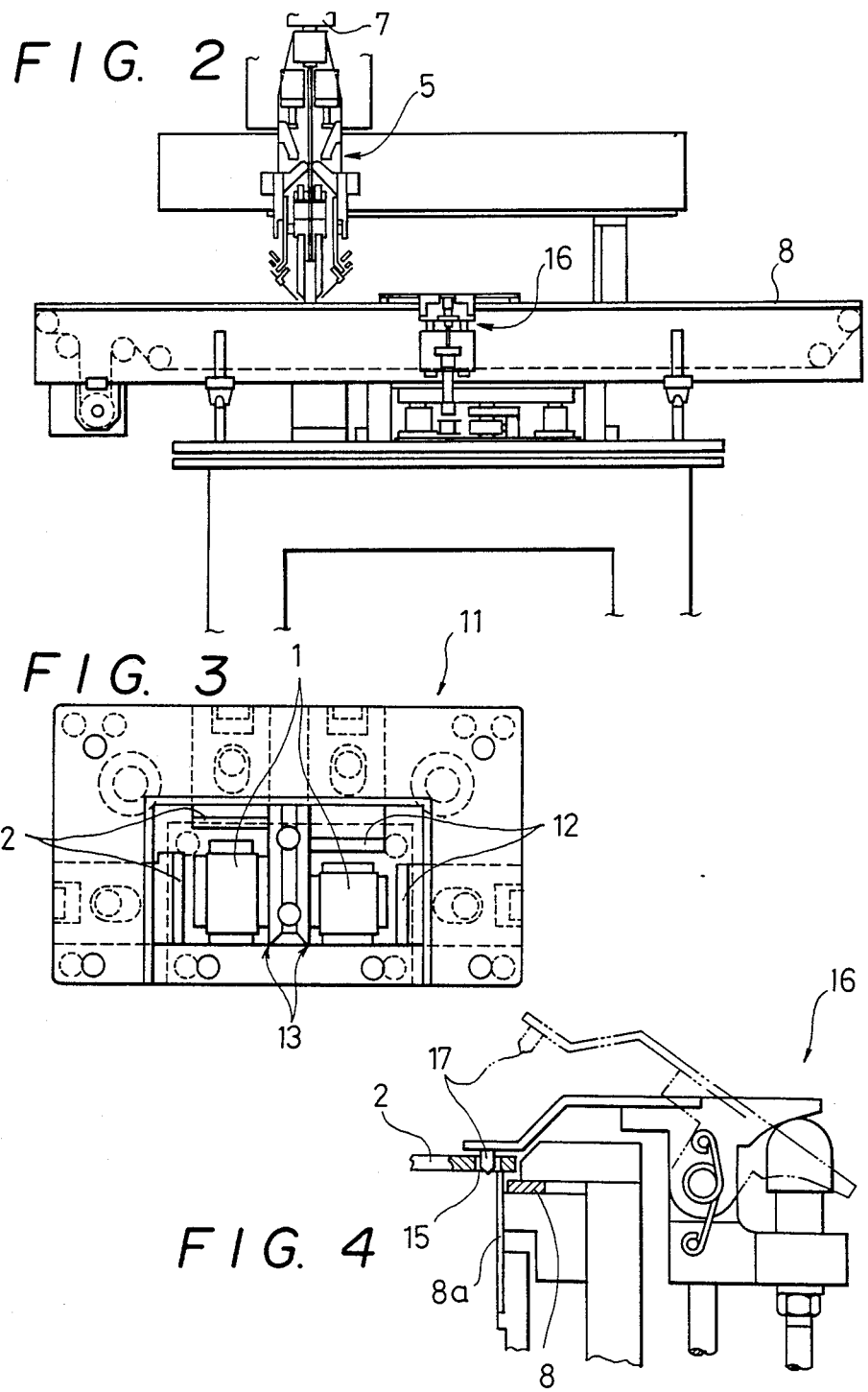

METHOD FOR SOLDERING ARRAYED TERMINALS AND AN AUTOMATIC SOLDERING DEVICE

FIELD OF THE INVENTION

The present invention relates to an automatic soldering method and an automatic soldering device for arrayed terminals, and in particular to an automatic soldering method and device ideal for soldering arrayed terminals on flat-pack ICs.

DISCLOSURE OF PRIOR ART

Recently, increasing use is being made of flat-pack ICs 1 in which pins (terminals) are soldered onto the surface of a base plate instead of being passed, through holes drilled through the base plate, to the underside of the base plate and then soldered to the underside of the plate as with conventional ICs in the past. Because there is no need to drill holes through the base plate of the IC, pins can be arrayed as multiple terminals at intermittent microscopic intervals, thus permitting the design of a smaller IC with a higher degree of performance.

PROBLEMS SOLVES BY THIS INVENTION

However, because the distance between the pins arrayed intermittently in connection with these flat-pack ICs was microscopic, it was easy for "bridging" to occur during soldering, that is, the formation of a bridge of solder between adjacent pin. This made it difficult to automate the soldering process.

SUMMARY OF THE INVENTION

This invention distinguishes itself from prior art techniques, processes, and apparatus by the provision of an automatic soldering method and device thereof which automatically solders arrayed terminals in a way that does not cause bridging.

More specifically, this invention is designed to prevent the soldering together of terminals by releasing the iron tip of the soldering iron from the arrayed terminals after solder has been applied to the multiple intermittently arrayed terminals, and more particularly by horizontally sliding the iron tip in a direction which is disposed at right angles to the direction of the arrayed terminals.

BRIEF DESCRIPTION OF THE DRAWINGS

The other purposes, features and advantages of this invention will be clarified in the following description which refers to the attached drawings, within which like reference characters designate like or corresponding parts throughout the several views, and wherein:

FIG. 2 is a side view of the device viewed from the direction of the arrow II in FIG. 1.

FIG. 3 is a plan view of the positioning stage.

FIG. 4 is a side view of the positioning pin mechanism.

PREFERRED EMBODIMENT OF THE INVENTION

Figure 1:
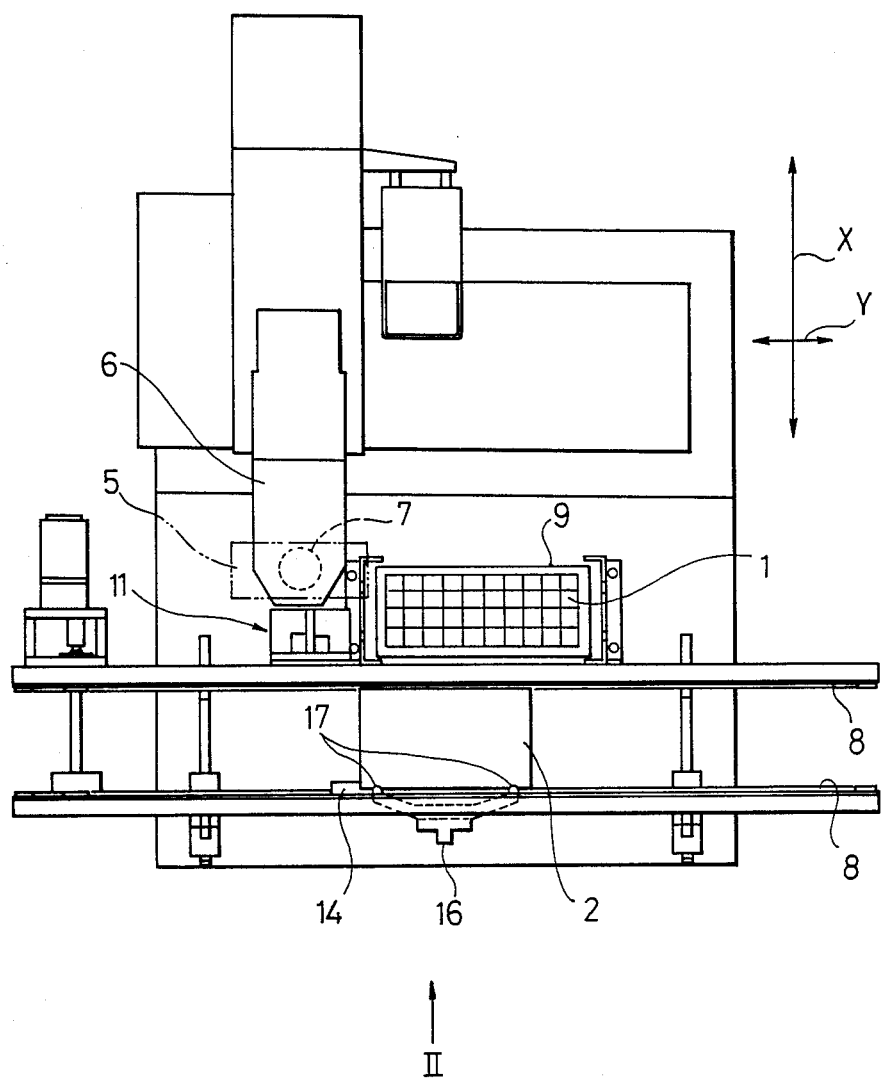
FIG. 1 shows a schematic plan view of a device which incorporates an automatic soldering device constructed according to the first embodiment of the present invention.

The present invention will now be described with reference to the attached drawings.

In the description which follows, the expressions indicating the direction of movement of the iron tip—"-the direction at right angles to the arrayed terminals", and "direction of release from the flat pack IC"—are in practice the same direction. For the purposes of the description, the latter term will be used when the object being soldered is the flat pack IC, while the former will be used when the flat pack is not specified as the object of soldering.

FIRST EMBODIMENT OF THE INVENTION

The first embodiment of the current invention will be described in connection with FIGS. 1 to 9 and FIGS. 17 and 18. First, the overall device incorporating the automatic soldering device for arrayed terminals of this invention will be described with reference to FIGS. 1 to 4.

The reference character 5 is the flat pack IC automatic soldering device or, in other words, the arrayed terminals automatic soldering device,—of this invention, mounted at an optional position upon the head 7 of a freely moving and freely rotating robot arm 6. A detailed description of this automatic soldering device 5 will now be given. Base plate 2, with only the insulated parts upon both sides thereof disposed upon the belt, is being continuously conveyed by means of a free flow conveyor 8 which has two belts. The reference character 9 is a tray containing many flat pack ICs 1, both upon upper and lower levels thereof.

The flat pack ICs 1 contained within the tray 9 are transported by means of vacuum conveyer mechanism 10 (FIG. 7) of the automatic soldering device to a positioning stage 11. Upon this positioning stage 11, the flat pack ICs 1 conveyed by means of the tray 9 and mechanism 10 are pushed horizontally and from two intersecting directions, into a corner 13 by pushing means 12, so that a flat pack IC 1 can be extracted from a precise position by means of the automatic soldering device. As indicated in FIG. 3, the positioning stage 11 has two stages, right and left, so as to enable two flat pack ICs 1 of differing shapes and sizes to be positioned. In use, either one of the stages is used. For demonstration purposes, FIG. 3 shows the right and left stages with flat pack ICs 1 of differing shapes and sizes.

The flat pack IC 1 positioned upon the positioning stage 11 is again lifted up by means of the vacuum conveyer mechanism 10 of the automatic soldering device 5, and is carried to a specified position upon the base plate 2 which has been stopped by means of stopper 14 of the free flow conveyer 8. Base plate 2 which has been stopped by means of stopper 14 is raised slightly by lifting means 8a as shown in FIG. 4, so as to avoid friction with the belt 8. The stationary position of base plate 2 is secured as a result of the insertion of positioning pins 17 of a positioning pin mechanism 16 provided upon the side of the free flow conveyor 8, into small holes 15 provided within a side edge portion of the stationary base plate 2. Then, the flat pack IC 1 placed upon the stationary base plate 2 is soldered to the printed circuit board wiring printed upon the base plate 2, using the automatic soldering device 5. The above describes the overall construction of a device incorporating the automatic soldering device 5 of this invention.

Figure 5:
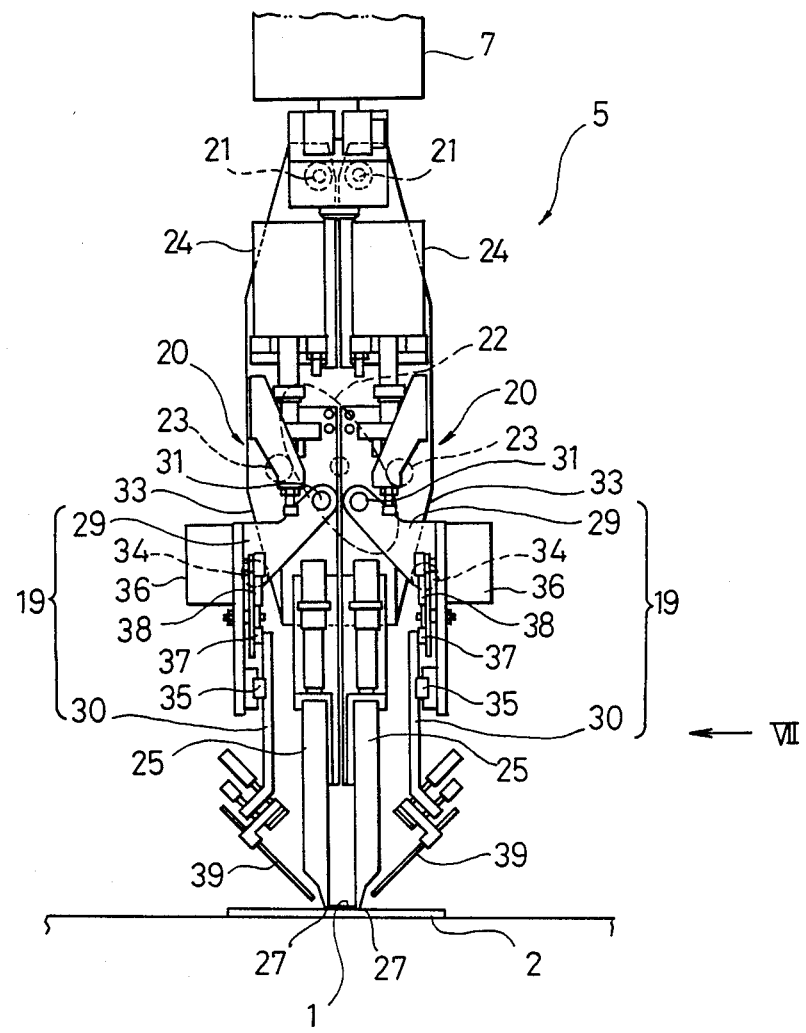
FIG. 5 is an overall side view showing the automatic soldering device with the extension frames closed.
Figure 6:
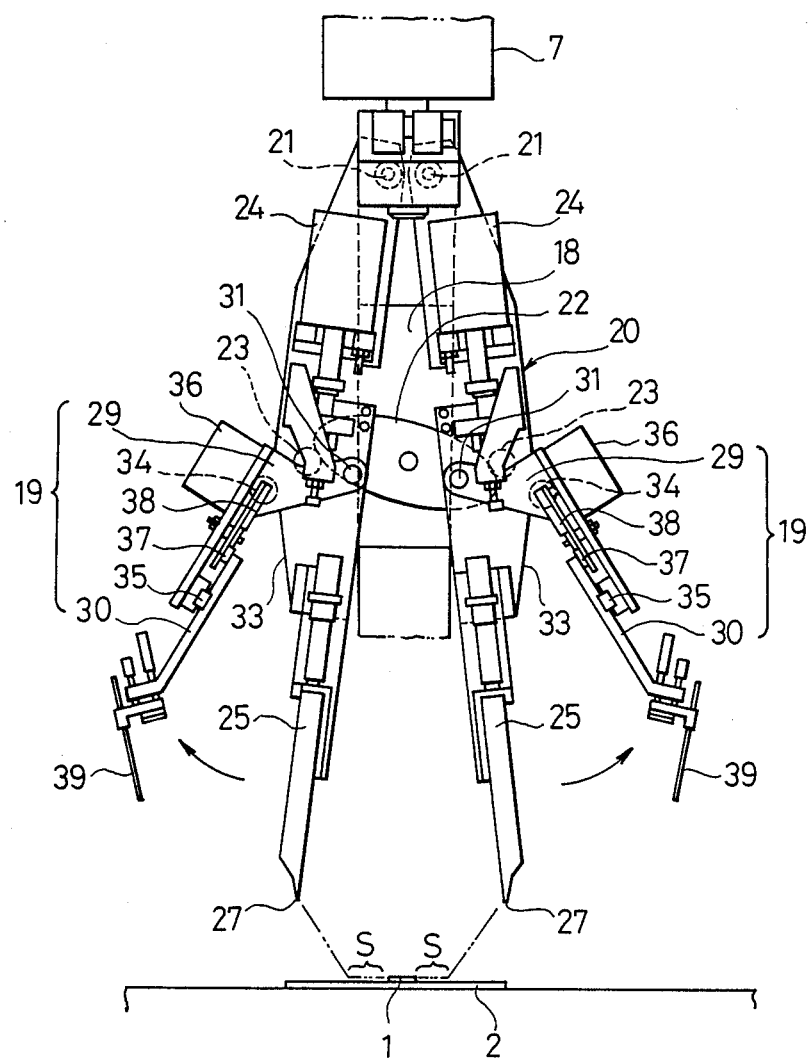
FIG. 6 is an overall side view of the automatic soldering device with the extension frames open.
Figure 7:
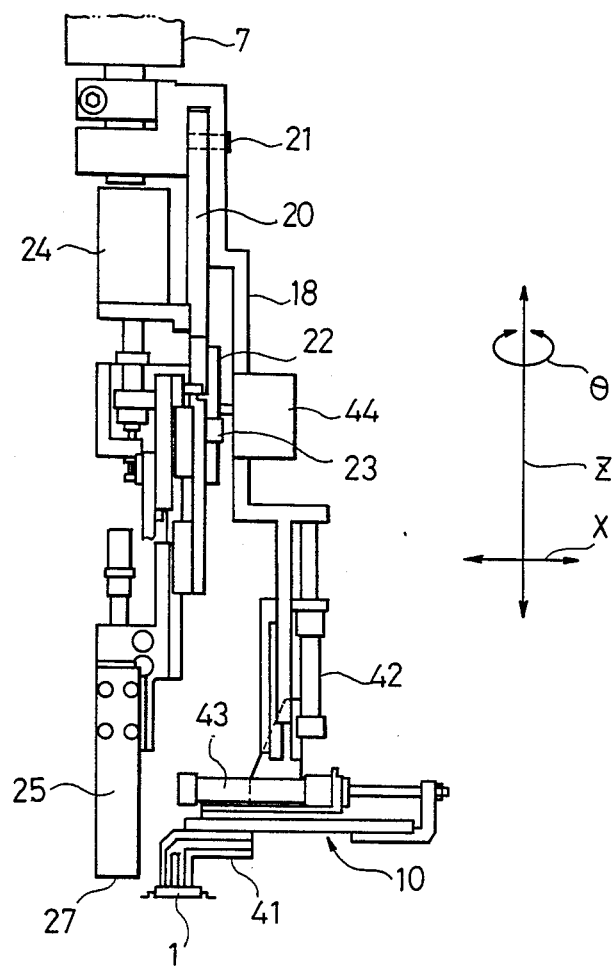
FIG. 7 is a side view viewed from the direction of the arrow VII in FIG. 5 with the solder supply mechanism having been omitted.

FIGS. 5 through 9 provide more details of the flat pack IC automatic soldering device. This automatic soldering device 5 is mounted upon head 7 of robot arm 6, as described above, and the entire device can be moved with respect to four axial directions X,Y,Z and $\Theta$: forwards/backwards as denoted by the X arrow direction of FIG. 1, right/left as denote by the Y arrow direction in FIG. 1, up/down as denoted by the arrow direction indicated in FIG. 7, and rotationally as denoted by direction $\Theta$ indicated in FIG. 7. A support plate 18 is fixed to the head 7 of the robot arm 6 as seen in FIG. 7, and upon the support plate 18 are mounted a pair of extension frames with a solder supply mechanism 19, as seen in FIGS. 5 and 6 and a vacuum conveyer mechanism 10. The extension frames 20 are hinged onto the upper surface of support plate 18 by means of rotating hinges 21 so as to be movable between open and closed positions. The opening and closing movements are performed by means of an extension cam 22 provided upon the support plate 18 as a result of the rotational the driving force of a motor 44 with the cam 22 acting upon cam followers 23 attached to both extension frames 20 which are given additional power in their approach with respect to each other.

Figure 17:
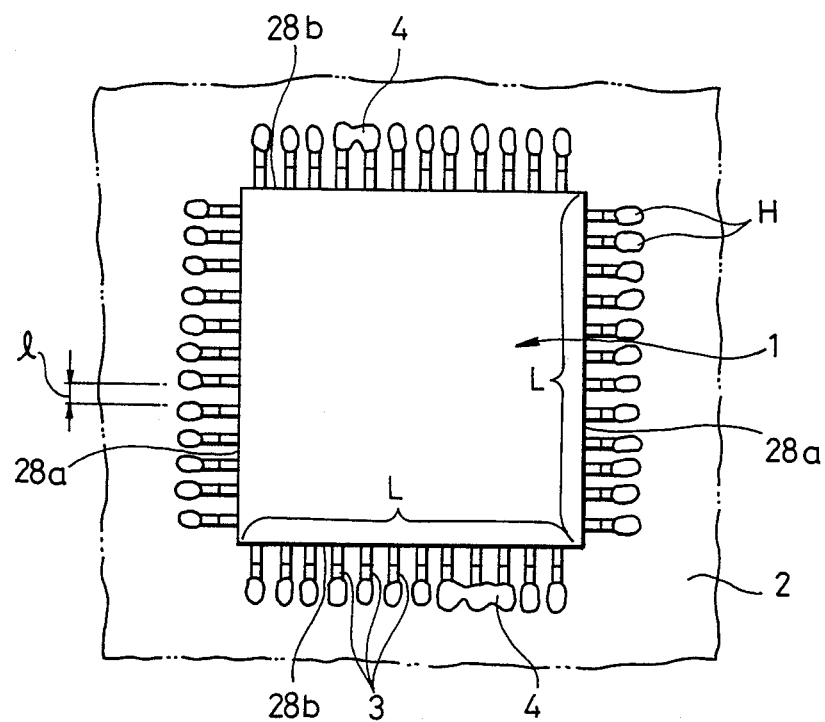
FIG. 17 is a plan view of a flat-pack IC.
Figure 18:
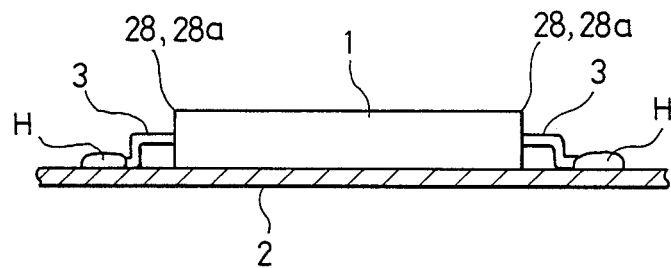
FIG. 18 is a side view of the flat-pack IC shown in FIG. 17.

At the end of each extension frame 20 there is provided a soldering iron 25. Each soldering iron 25 is supplied with additional power which always acts in the downward direction by means of a spring which is not shown on the drawing. Furthermore, the iron tip 27 of each soldering iron 25 is flattened at the end, its width having a length which corresponds to the length L of a side of the flat pack IC 1, as seen in FIG. 17, along which are arrayed multiple and intermittently spaced pins 3 as terminals. The width of the iron tip 27 is set in accordance with the length L of the side of the flat pack IC 1 to be soldered. When the flat pack IC 1 is rectangular, the solder tip is adjusted to the length of the longer side thereof.

Figure 8:
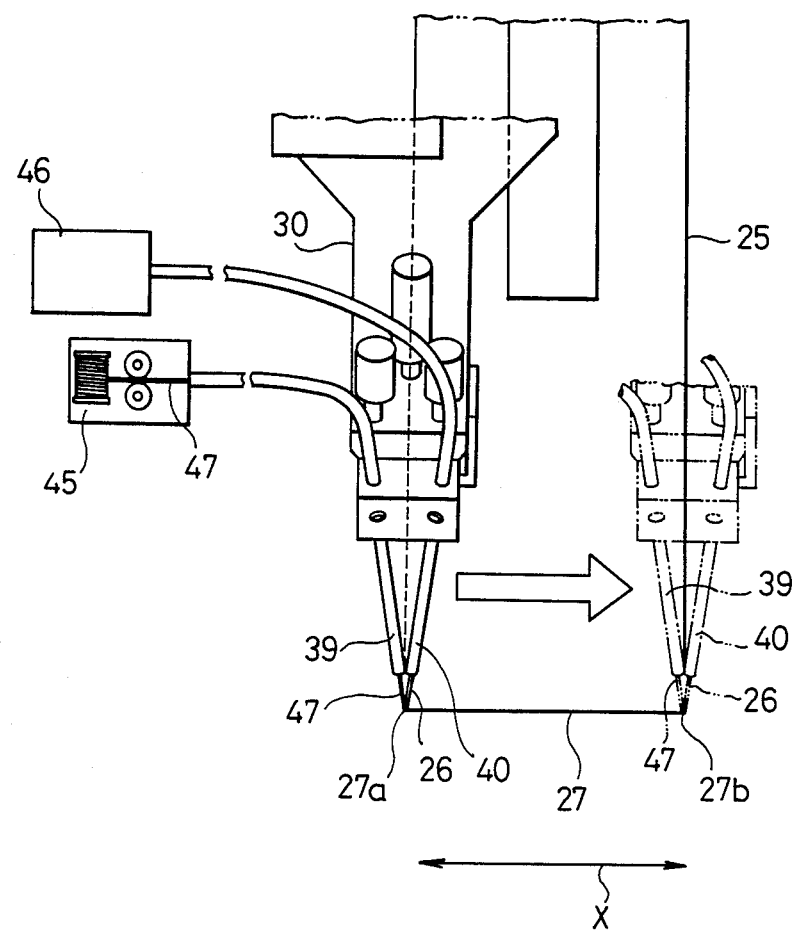
FIG. 8 is an enlarged view of the iron tip applying solder.

As has been noted, each one of the extension frames 20 are provided with a solder supply mechanism 19 consisting of a rotational arm 29 and a horizontal slide arm 30. Each rotational arm 29 is attached to the extension frame 20 at a rotational fulcrum 31. Each rotational arm 29 is also provided with a cam follower 34 correspondingly engaged with a sloping part 33 of the extension frame 20. By moving the entire rotational arm 29 upwardly using a air cylinder 24, the cam follower 34 moves along the sloping part 33, and the rotational arms 29 rotate apart. Each rotational arm 29 also has a horizontal slide arm 30 retained by means of a slide ball guide 35. Each horizontal slide arm 30 is moved horizontally as a result of rotational torque from a pulse motor 36 provided upon the side of the rotational arm 29 as transmitted to a rack 37 and a pinion 38. At the end of each horizontal slide arm 30, a thread solder supply nozzle 39 for the provision of thread solder 47, and the end of a flux supply nozzle 40 for the supply of flux are held together as seen in FIG. 8. The thread solder supply nozzle 39 is connected to a thread solder feed unit 45 for the supply of thread solder 47. The flux supply nozzle 40 is connected to a flux supply dispenser 46. Therefore the adjoining parts of the thread solder supply nozzle 39 and the flux supply nozzle 40 slide horizontally forwardly and backwardly in the direction of the arrow X, as seen in FIG. 8 along the iron tip 27 of the soldering iron 25 so as to provide for the sequential supply of thread solder 47 and flux 26.

The vacuum conveyer mechanism 10 is mounted upon the support plate 18 and is also connected to a vacuum suction device not shown in the drawing. The vacuum heads 41 of this vacuum conveyer mechanism 10 can be moved upwardly and downwardly and pivoted with respect to each soldering iron 25 using the two hydraulic cylinders 42 and 43.

The process of soldering using the automatic soldering device 5 constructed as described above will now be explained.

First the head 7 is moved by means of the robot arm 6, the vacuum conveyer mechanism 10 of the retaining plate 18 is operated and the vacuum head 41 is positioned above the tray 9. Then using the cylinder 42 the vacuum head 41 is lowered and a particular flat pack IC 1 is extracted from the tray 9 using vacuum suction and moved to the positioning stage 11. The flat pack IC 1 moved to the positioning stage 11 is inserted in to either one of the stages shown in FIG. 3 and is pushed from two directions into corner 13 by the pushing means 12 so as to be positioned in an accurate "base position".

This base position is used by the automatic soldering device 5 as the "starting position" for moving a flat pack IC 1 to a specified position upon the base plate 2 which has already been stopped at a predetermined position by means of stopper 14 of the free flow conveyer 8. Next the automatic soldering device 5 which has been moved means of the robot arm 6 to a position above the positioning stage 11 begins the automatic soldering processing.

First, the vacuum head 41 of the vacuum conveyer mechanism 10 is lowered to the base position (starting position) described above and extracts a flat pack IC 1 from the positioning stage 11 using vacuum suction. The entire automatic soldering device 5 is then moved above the specified soldering position upon the base plate 2 which has been previously stopped on top of the free flow conveyer 8 by means of stopper 14. The movement of the automatic soldering device 5 itself is completely computer controlled and at the point where it is positioned over the base plate 2, the iron tip 27 of the soldering iron 25 is already accurately positioned for soldering the base plate 2.

Secondly, with the flat pack IC 1 still attached by means of suction to the vacuum head 41, it is moved by means of cylinder 43 in the direction of the arrow X from a rear position to a forward position (from right to left in FIG. 7) into position between the soldering irons 25. Then the vacuum conveyer mechanism 10 descends using cylinder 42 and places the flat pack IC 1 onto the specified position of the base plate 2 where it stays positioned.

Thirdly, each soldering iron 25 and solder supply mechanism 19 descend in accordance with the control of the automatic soldering device 5, and the solder tip 27 of each soldering iron 25 is pushed against the first two sides, either set of two opposing sides of square flat pack IC 1, that is, 28a, 28a, or 28b, 28b. The thread solder supply nozzle 39 and the flux supply nozzle 40 held at the end of the horizontal slide arm 30 of each solder supply mechanism 19 are positioned at one end of each of the iron tips 27, that is, the front end 27a as seen in FIG. 8. Thread solder 47 and flux 26 are then supplied from the ends of the thread solder supply nozzle 39 and the flux supply nozzle 40 respectively. Then, with the thread solder 47 and the flux 26 supplied from the thread solder supply nozzle 39 and the flux supply nozzle 40 to the solder tip 27 in a converging manner, slide arm 30 is slid horizontally backwards, or to the right as seen in FIG. 8) along the iron tip 27 and moved to the other end of the iron tip 27, that is, rear end 27b as seen in FIG. 8. The thread solder 47 and the flux 26 are thereby continuously and evenly applied to opposite sides 28a, 28b of the flat pack IC 1.

Figure 9:
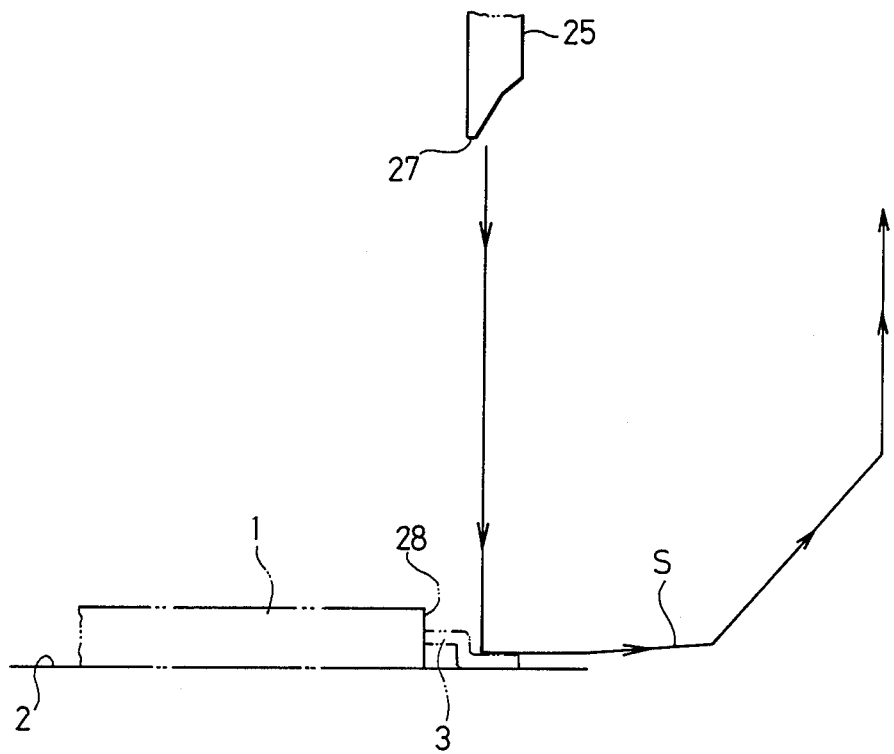
FIG. 9 shows the tracks of the iron tip.
Figure 10:
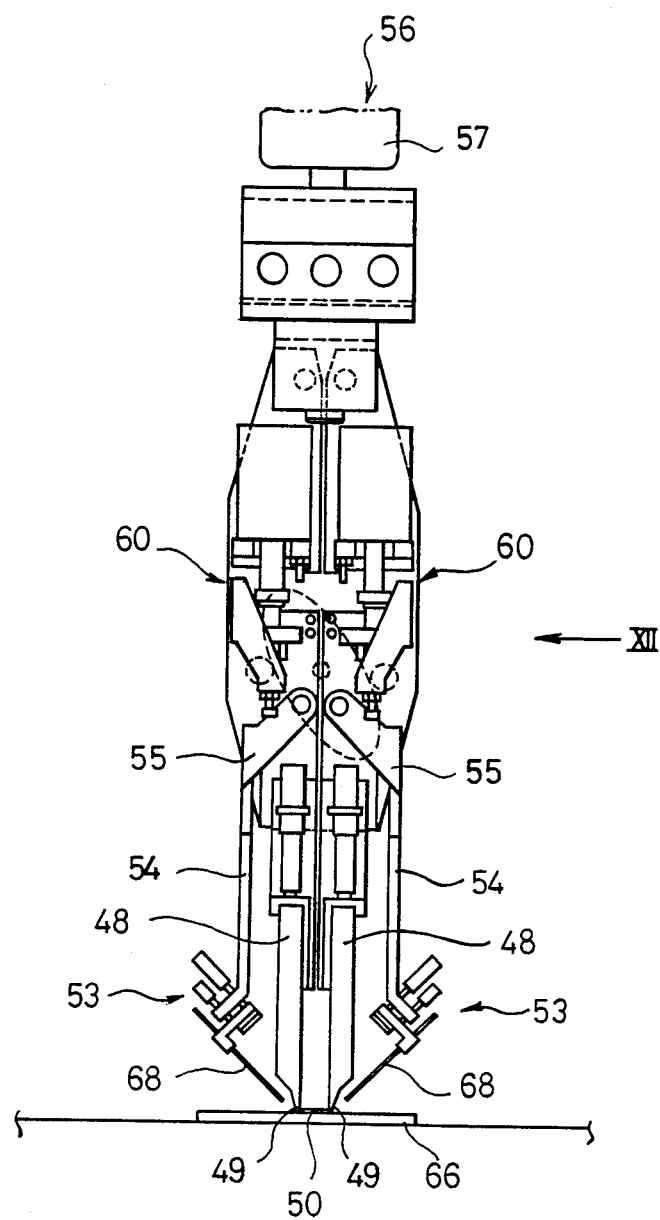
FIG. 10 is an overall side view of the second embodiment of this invention, corresponding to FIG. 5.
Figure 11:
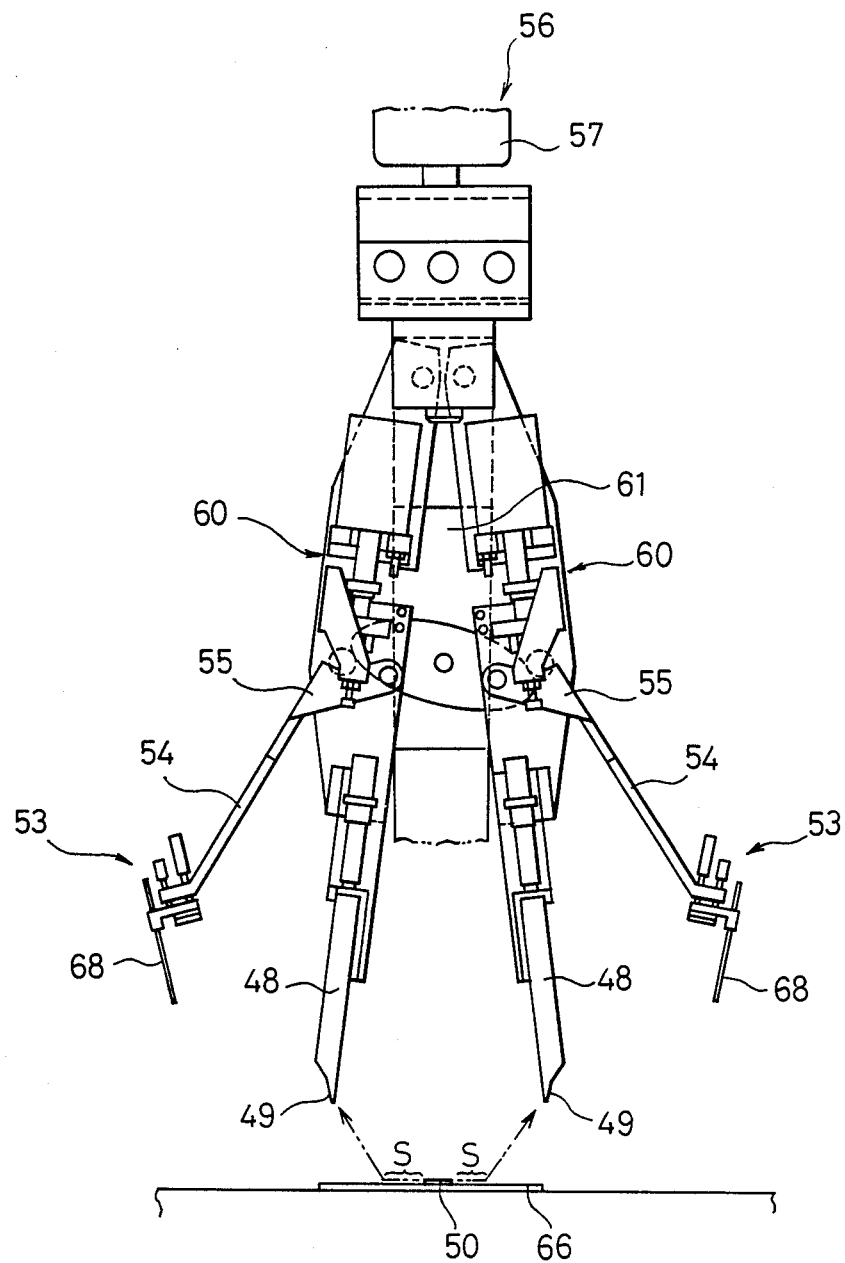
FIG. 11 is a side view of the entire automatic soldering device in FIG. 10, with its extension frames open.
Figure 12:
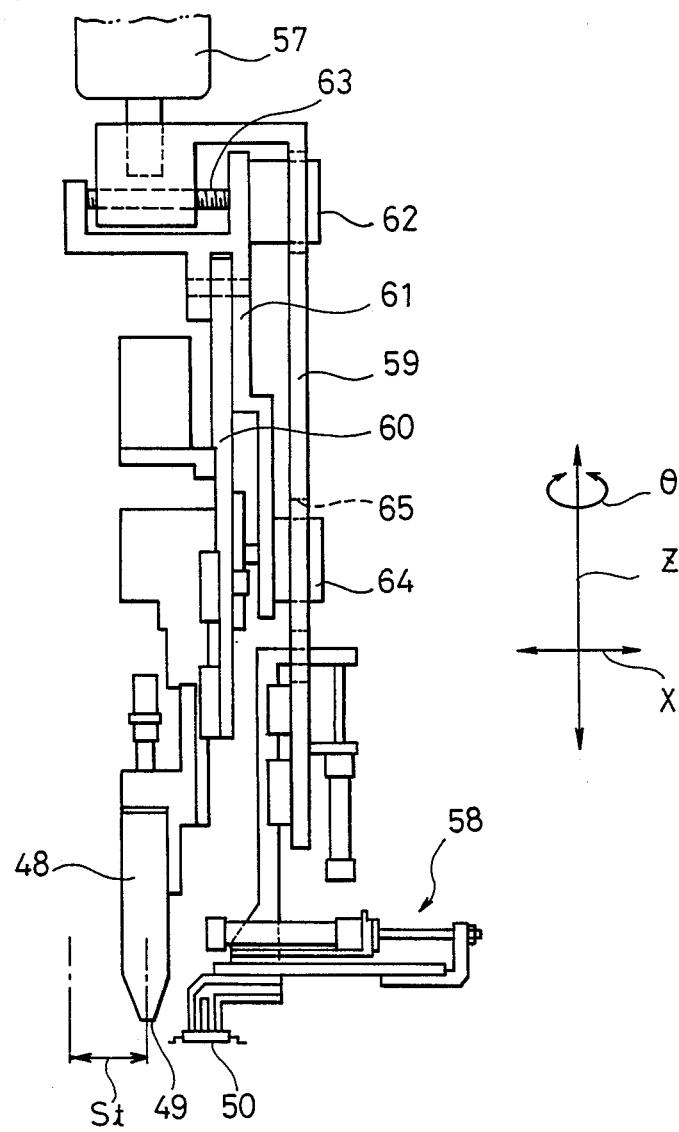
FIG. 12 is a side view viewed from the direction of the arrow XII in FIG. 10 with the solder supply mechanism omitted.

Then, at the fourth stage, when the horizontal slide arm 30 has been slid horizontally from one end of the iron tip 27 to the other end, the extension cam 22 positioned in the center of the support plate 18 rotates, pressure is applied to the cam follower 23 of each extension frame 20, and the extension frames 20 separate as a result of their pivotal movement about their hinge mechanisms 21. Because the iron tip 27 is located at a substantial distance away from each rotational hinged part 21, the iron tip 27 moves substantially horizontally in relation to the flat pack IC 1. In other words because of the large distance from each rotational hinged part 21 to the iron tip 27, the tracked movement of each iron tip 27 describes a large arc, and the tracked movement of each iron tip 27 above the terminals, that is, pins 3 is substantially horizontal. The entire automatic soldering device 5 is then raised by means of the robot arm 6. The tracked movement of each iron tip 27 at that time is shown in FIG. 9. By providing a horizontal tracked movement S in the direction away from the flat pack IC 1, each iron tip 27 applies an appropriate amount of thread solder 47 each pin 3 of flat pack IC 1 and the so-called "bridging phenomenon" wherein the melted solder 47 on adjacent pins 3 joins together is prevented because the excess solder is carried away upon the iron tip 27 and the thread solder 47 melted upon the iron tip 27 does not spread very much because of surface tension characteristics. At this point the first two sides for example 28a, 28a of the flat pack IC 1 have been soldered. In the following fifth stage, the vacuum conveyer mechanism 10 releases its vacuum and moves upwardly and the vacuum head 41 interposed between the two soldering irons 25 is withdrawn and moves backwardly.

In the sixth stage, the automatic soldering device 5 which has completed soldering the opposite sides 28a, 28a, and has been raised upwardly is carried to a cleaning device not shown in the drawing, where pressurized air is blown onto each soldering iron 25 disposed in its open position, thereby removing any traces of solder attached to the iron tip 27. During cleaning, each solder supply mechanism 19 is maintained at a position separated from its associated extension frame 20, so as not to hinder the cleaning of the soldering iron 25 which is mounted upon the end of such extension frame 20. This open position at which each solder supply mechanism 19 is separated from its associated extension frame 20 is also convenient when replacing the soldering irons 25, and prevents the heating and melting of the thread solder 47 in the solder supply mechanism 19 by means of soldering iron 25 during non-soldering work. When cleaning is completed, in the seventh step, the automatic soldering device 5 is returned to its position above the base plate 2 and is lowered after rotating 90 degrees, and the remaining two sides 28b, 28b of the flat pack IC 1 are soldered in the same manner as described above.

SECOND EMBODIMENT

The second example of an embodiment of this invention will be described with reference to FIGS. 10 to 14. Description of those parts which are common to both inventions will be omitted from the description.

Figure 13:
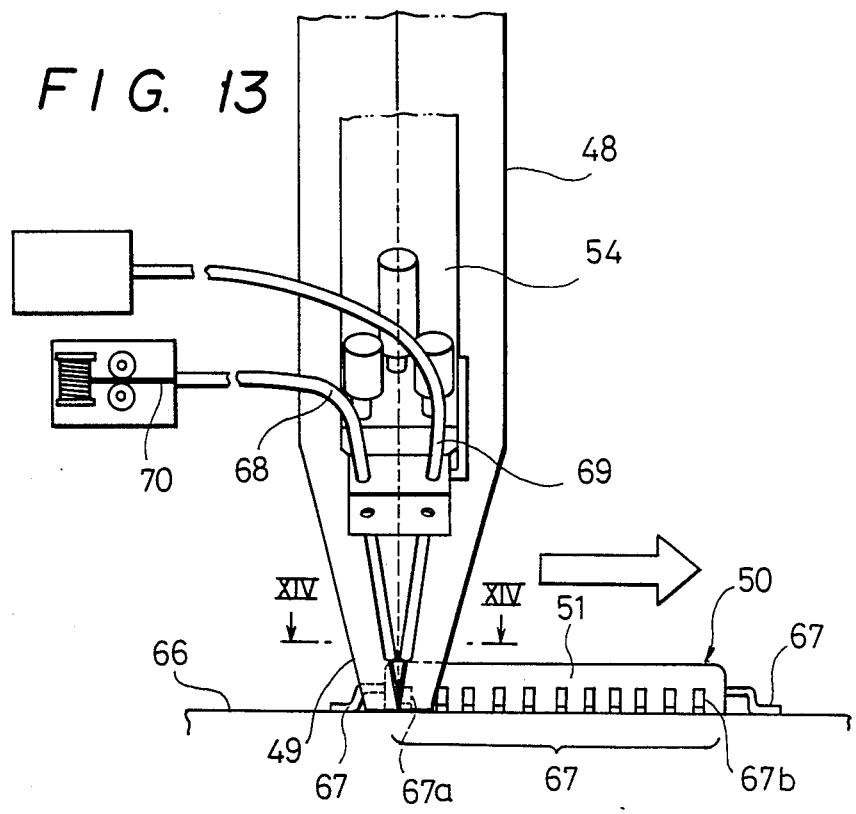
FIG. 13 is an enlarged view of the iron tip in another embodiment of the invention.

First, in this embodiment, the iron tip 49 of each soldering iron 48 differs from the soldering iron tip 27 in the previous example in that it is narrower than a length of a side 51 of the flat pack IC 50 as seen in FIG. 13.

Figure 14:
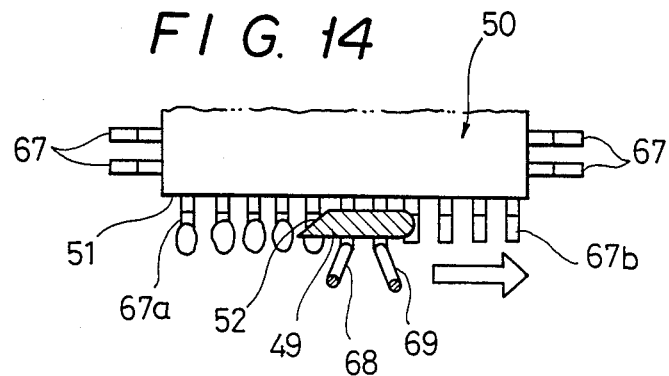
FIG. 14 is a cross-section view viewed in the direction XIV—XIV in FIG. 13.

A cross section of each iron tip 49 shows, as in FIG. 14, that one side of it consists of an inclined part 52. Also the arm 54 of each solder supply mechanism 53 is joined to the rotational arm 55, and does not move horizontally forwardly and backwardly (in the direction of arrows X) in relation to its associated soldering ring 48.

With respect to the mounting of the head 57 upon the robot arm 56, the mounting plate 59 which supports the vacuum conveyer mechanism 58 is attached to head 57. Therefore, the vacuum conveyer mechanism 58 is fixed with respect to the head 57. Also the upper part of support plate 61 which supports the pivotable extension frames 60 is provided with a dual-directional rotating feed screw 63 associated with a pulse motor 62. This feed screw 63 is threadly engaged with the upper part of the mounting plate 59 which supports the vacuum conveyer unit 58, and through means of the pulse motor 62 rotating this feed screw 63 in either one of the two rotatable directions, the entire support plate 61 can be made to move horizontally in the forward or backward direction, that is in the direction of the arrow X. In other words, each soldering iron 48 is movable with respect to the vacuum conveyer unit 58, and moves linearly only through or by a stroke amount St corresponding to the length of the side 51 of the flat pack IC 50. The mounting plate 59 also has an opening 65 defined therein so as to prevent it from interfering with the motor 64 which is provided upon the support plate 59 in order to drive the cam, not numbered, which engages the extension frames 60 in a manner similar to the cam 22 engaging the extension frames 20 of the first embodiment.

Next the operation will be described.

Up to the point where the flat pack IC 50 is placed at a specified position upon the base plate 66 by means of the vacuum conveyer mechanism 58, the operation is the same as described for the previous embodiment. Then the iron tip 49 of each soldering iron 48 is pushed into position so as to be disposed at the first or front terminal pin 67a of each of the first two opposite sides of flat pack IC 50, and at the same time, the solder supply nozzle 68 and the flux supply nozzle 69 are positioned relative to each other. Then while supplying thread solder 70 and flux to each iron tip 49 from the thread solder supply nozzle 68 and the flux supply nozzle 69, each iron tip 49 is moved towards pin 67b disposed at the other or back terminal side of the flat pack IC 50 by means of the rotation of the feed screw 63. As shown, the thread solder 70 is applied from the outside of each soldering iron 48, but the melted thread solder 70 is also circulating in the other side of the soldering iron 48, and each of the pins 67 is accurately soldered in succession as a result of the movement of each soldering iron 48. When each soldering iron 48 is moving, it has its sloping part 52 as previously described and formed at one end of the iron tip 49, disposed in a trailing mode or at an upstream region of the soldering path with respect to the direction of movement of the iron tip 49, as denoted by the arrows in FIGS. 13 and 14, thus effectively preventing bridging as described. The reason for the construction of each iron tip 49 so as to have a deformed sloping part 52 as shown in the cross section is so that when moving each iron tip 49 over the area to be soldered, including pins 67, while continuing to supply thread solder 70 and flux 78, and then soldering the pins 67, only the necessary amount, and no more, of solder is applied, and bridging does not occur. The reason for, and mechanism by which, bridging is prevented when each iron tip 49 is shaped so as to include the inclined part 52 is not entirely clear. However the inventor has proven through various experiments that while slight variations in the prevention of bridging occur with different shapes of the inclined part 52, an inclined part 52 shaped as shown in FIG. 14 is most effective for preventing the occurrence of bridging. Then, once each iron tip 49 reaches the last pin 67b, the extension frames 60 pivot toward their open position as in the previous embodiment and each iron tip 49 of each soldering iron 48 is caused to move substantially horizontally in a direction away from the flat pack IC 50. This is designed to prevent bridging within the vicinity of the pins 67b located at the downstream terminal side of the flat pack IC 50. Remaining operations are the same as in the previous embodiment.

In the above description, a slide mechanism with a feed screw 63 was employed to move each soldering iron 48 horizontally. However, the same device can also be employed to move each soldering iron 48 horizontally by moving the entire robot arm device 56 horizontally. In this case however, the flat pack IC 50 must be already attached to the base plate 66.

Third Embodiment

Figure 15:
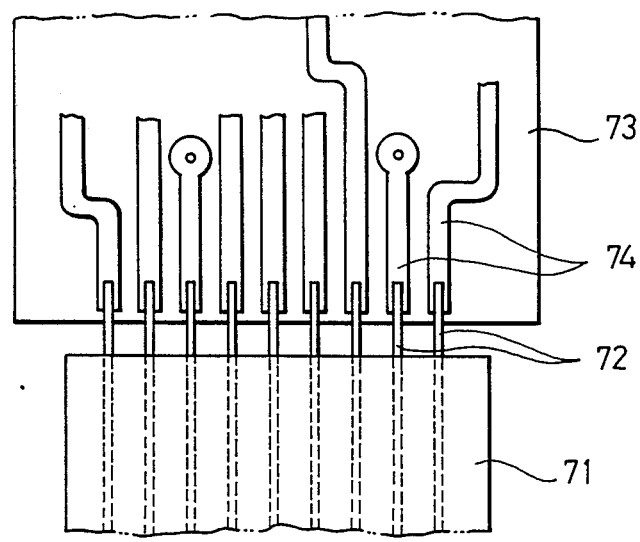
FIG. 15 is a plan view of the FPC and PCB in a third embodiment of the invention.
Figure 16:
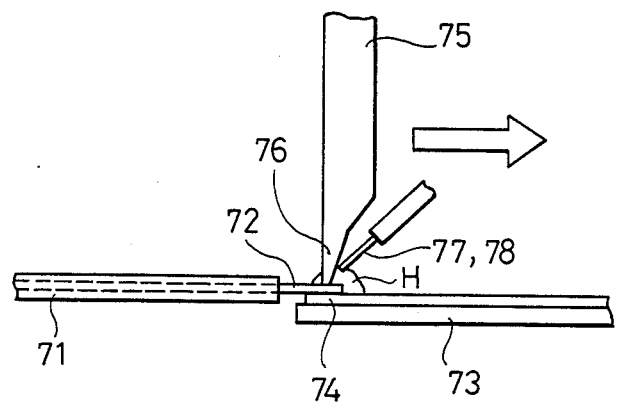
FIG. 16 shows the FPC and PCB of FIG. 15 during soldering.

FIGS. 15 and 16 depict a third embodiment of this invention.

In this embodiment, the device for soldering does not employ extension frames 20, 60 as in both of the previous embodiments. Instead it suffices to have a single soldering iron 75 which can supply thread solder 77 and flux 78, and which can move horizontally by means of a robot arm, not shown. Also in this embodiment, a soldering iron with a broad iron tip is used, as shown in FIG. 8, but of course, a soldering iron with a narrow iron tip as shown in FIG. 13 can also be used.

In this embodiment example, we will describe a case involving the soldering of copper terminals 72 of an FPC (flexible printed circuit) 71 to the copper wiring terminals 74 of a PCB (printed circuit board) 73. First, each of the terminals 72 of the FPC 71 are overlaid upon the wiring terminals 74 of the PCB 73. Then the iron tip 76 of the soldering iron 75 is pushed against the overlaid part as shown in FIG. 16. Then thread solder 77 and flux 78 are supplied to the iron tip 76. Once thread solder 77 has been supplied, the robot arm slides the soldering iron 75 horizontally in a direction disposed at right angles to the arrayed terminals 72 and wiring terminals 74, or in other words left to right as seen in FIG. 15. In this way, the terminals 72 of FPC 71 are accurately soldered to the wiring terminals 74 of PCB 73, without a "bridge" forming.

As described above, the method of soldering arrayed terminals in accordance with the present invention is effective in permitting accurate soldering of terminals without creating a bridge between them, because the iron tip of the soldering iron is made to slide horizontally at right angles with respect to the arrayed direction of the terminals.

Furthermore, the automatic soldering device for arrayed terminals of the present invention automatically performs soldering through its extension frames, soldering iron and soldering mechanism. It is effective in markedly improving the efficiency of the soldering operation compared with the manual methods previously used, and also for guaranteeing consistent quality in the results.

Obviously, many modifications and variations of the present invention are possible in light of the above teachings. It is therefore to be understood that within the scope of the appended claims, the present invention may be practiced otherwise than as specifically described herein.

What I claim:

1. A method of soldering terminals arrayed in a first predetermined direction, comprising the steps of:
   moving the tip of a soldering iron against said terminals which are arrayed in said first predetermined direction with a predetermined amount of spacing defined between successive terminals;
   supplying solder to said soldering iron tip so as to perform a soldering operation upon said arrayed terminals; and
   upon completion of said soldering operation, horizontally moving said soldering iron tip in a second direction which is substantially perpendicular to said first predetermined direction of said arrayed terminals.

2. The soldering method as claimed in claim 1, wherein:
   said arrayed terminals are disposed along the side of a flat pack IC positioned upon a base plate.

3. The soldering method as claimed in claim 2, wherein:
   said soldering iron tip is flat and at least broader than the length of said side of said flat pack IC.

4. The soldering method as claimed in claim 2, wherein said soldering iron tip is narrower than the length of said side of said flat pack IC, and said method comprises the additional steps of:
   moving said soldering iron tip against a first one of said arrayed terminals disposed at one end of said side of said flat pack IC; and
   while continuing to supply solder to said soldering iron tip, moving said soldering iron tip towards the last one of said arrayed terminals disposed upon the other end of said side of said flat pack IC.

5. The method as set forth in claim 1, wherein:
said arrayed terminals are disposed along opposite sides of a flat pack IC.

6. The method as set forth in claim 5, wherein:
two soldering irons are employed so as to simultaneously perform said soldering operation upon said arrayed terminals disposed upon said opposite sides of said flat pack IC.

7. The method as set forth in claim 1, wherein:
said terminals are disposed along said first predetermined direction within a substantially planar array; and
said soldering iron tip is moved in said second direction which is incorporated within a plane defining said substantially planar array of said arrayed terminals.

8. The method as set forth in claim 7, further comprising the step of:
retracting said soldering iron, in a direction which is substantially perpendicular to said plane defined by said first predetermined direction of said arrayed terminals and said second direction of said movement of said soldering iron tip, after said soldering iron tip has been moved in said second direction relative to said arrayed terminals upon completion of said soldering operation.

9. An automatic soldering device for soldering terminals arrayed in a first predetermined direction, comprising:
at least one support member;
at least one soldering iron mounted upon said support member;
solder supply means for supplying solder to the tip of said soldering iron; and
means for moving said support member and said at least one soldering iron mounted thereon into engagement with said arrayed terminals for the performance of a soldering operation, and for horizontally moving said support member and said at least one soldering iron mounted thereon in a second direction which is substantially perpendicular to said first predetermined direction of said arrayed terminals, upon completion of said soldering operation.

10. The automatic soldering device for arrayed terminals as claimed in claim 9 wherein:
said at least one support member comprises a pair of extension frames which mutually approach and separate with respect to each other and which are mounted upon a support plate which is fixed upon the head of a robot arm which has four degrees of freedom with respect to three predetermined axes;
said at least one soldering iron comprises a pair of soldering irons which are mounted upon the ends of said extension frames;
said solder supply means comprises a solder supply mechanism which can approach and retreat with respect to said extension frames; and
a vacuum conveyor mechanism which is mounted upon a support plate of said robot arm for extracting a flat pack IC, upon which said arrayed terminals are disposed, from a conveyor, using vacuum suction, for conveying and positioning said flat pack IC in connection with said soldering operation.

11. The automatic soldering device for arrayed terminals as claimed in claim 10, wherein:
said soldering iron tip is flat and at least broader than the length of a side of said flat pack IC.

12. The automatic soldering device for arrayed terminals as claimed in claim 10, wherein:
said soldering iron tip is narrower than the length of a side of said flat pack IC; and
means for moving said soldering iron tip form a first one of said terminals disposed at one end of said side of said flat pack IC towards the last one of said terminals disposed at the other end of said side of said flat pack IC while said solder supply means supplies solder to said soldering iron tip.

13. The automatic soldering device for arrayed terminals as claimed in claim 12, wherein:
said soldering iron tip has a cross-sectional configuration such that the trailing end of said soldering iron tip, as viewed in the direction of movement of said soldering iron tip, is inclined outwardly in said trailing direction.

14. The soldering device as set forth in claim 12, wherein:
said means for moving said soldering iron tip from said one end of said flat pack IC to said other end of said flat pack IC comprises a screw-thread stepping motor drive.

15. The soldering device as set forth in claim 10, wherein:
said terminals of said flat pack IC are disposed upon opposite sides of said flat pack IC; and
said soldering irons are disposed upon opposite sides of said flat pack IC so as to simultaneously perform said soldering operation with respect to said terminals of said flat pack IC.

16. The soldering device as set forth in claim 10, wherein:
said three predetermined axes are mutually orthogonal with respect to each other.

17. The soldering device as set forth in claim 9, wherein:
said means for moving said support member and said at least one soldering iron comprises a motor-driven cam.

18. The soldering device as set forth in claim 9, wherein:
said terminals are defined upon a flexible printed circuit (FPC).

19. The soldering device as set forth in claim 9, wherein:
said at least one soldering iron comprises a pair of soldering irons; and
said at least one support member comprises a pair of support members pivotable with respect to each other between open and closed positions corresponding to non-soldering and soldering positions, respectively.

20. The soldering device as set forth in claim 19, wherein:
said arrayed terminals are disposed upon a flat pack having said arrayed terminals disposed upon four sides thereof; and
said soldering irons can simultaneously perform said soldering operation in connection with two oppositely disposed sides of said flat pack.

* * * * *